United States Patent
Jin

(10) Patent No.: US 9,765,243 B2
(45) Date of Patent: Sep. 19, 2017

(54) DOUBLE INITIATED FAST CROSSLINKING EVA ADHESIVE FILM

(71) Applicant: HANGZHOU FIRST PV MATERIAL CO. LTD., Hangzhou, Zhejiang Province (CN)

(72) Inventor: Ping Jin, Zhejiang (CN)

(73) Assignee: HANGZHOU FIRST PV MATERIAL CO., LTD., Zhejiang Province (CN)

( * ) Notice: Subject to any disclaimer, the term of this patent is extended or adjusted under 35 U.S.C. 154(b) by 0 days.

(21) Appl. No.: 14/777,689

(22) PCT Filed: Aug. 7, 2014

(86) PCT No.: PCT/CN2014/083889
§ 371 (c)(1),
(2) Date: Sep. 16, 2015

(87) PCT Pub. No.: WO2015/096484
PCT Pub. Date: Jul. 2, 2015

(65) Prior Publication Data
US 2016/0272852 A1 Sep. 22, 2016

(30) Foreign Application Priority Data
Dec. 27, 2013 (CN) .......................... 2013 1 0739474

(51) Int. Cl.
| | |
|---|---|
| *C09J 123/08* | (2006.01) |
| *C09J 7/00* | (2006.01) |
| *H01L 31/04* | (2014.01) |
| *C08K 5/3435* | (2006.01) |
| *C08K 5/357* | (2006.01) |
| *C08K 5/541* | (2006.01) |
| *C08K 5/5425* | (2006.01) |
| *H01L 31/048* | (2014.01) |

(52) U.S. Cl.
CPC .............. *C09J 123/08* (2013.01); *C09J 7/00* (2013.01); *H01L 31/0481* (2013.01); *C08K 5/3435* (2013.01); *C08K 5/357* (2013.01); *C08K 5/541* (2013.01); *C08K 5/5425* (2013.01); *C09J 2203/322* (2013.01); *C09J 2423/04* (2013.01); *C09J 2431/00* (2013.01); *Y02E 10/50* (2013.01)

(58) Field of Classification Search
CPC ...... C09J 123/08; C09J 7/00; C09J 2203/322; C09J 2423/04; C09J 2431/00; H01L 31/0481; C08K 5/3435; C08K 5/357; C08K 5/541; C08K 5/5425
USPC .......................................................... 524/97
See application file for complete search history.

(56) References Cited

U.S. PATENT DOCUMENTS

| | | | |
|---|---|---|---|
| 4,710,539 A | 12/1987 | Siadat et al. | |
| 2012/0309878 A1* | 12/2012 | Inoue ................ | C08L 23/0876 524/314 |

FOREIGN PATENT DOCUMENTS

| | | |
|---|---|---|
| CN | 10-1921425 A | 8/2007 |
| CN | 101728443 A | 6/2010 |
| CN | 101935504 A | 1/2011 |
| JP | 2010270285 A | 12/2010 |

OTHER PUBLICATIONS

Derwent Abstract for CN101921425, Aug. 2007.*
International Search Report in International Application No. PCT/CN2014/083889, filed Aug. 7, 2014.

* cited by examiner

*Primary Examiner* — Angela C Scott
(74) *Attorney, Agent, or Firm* — Saliwanchik, Lloyd & Eisenschenk

(57) ABSTRACT

The invention provides a dual-initiated and fast cross-linked EVA (ethylene/vinyl acetate copolymer) film for the encapsulation of solar modules, which greatly enhances the speed of the encapsulation. The EVA film is mainly prepared from the following raw materials: 100 parts by mass of ethylene/vinyl acetate copolymer, 0.01 to 1.5 parts by mass of a free-radical photoinitiator, 0.01 to 1.5 parts by mass of a free-radical thermal initiator, 0.5 to 10 parts by mass of an auxiliary cross-linking agent, 0.1 to 5 parts by mass of a tackifier and 0.01 to 5 parts by mass of a light stabilizer. The present invention adds photothermal dual-initiated free-radical initiators and the auxiliary cross-linking agent of multi-functional acrylates or methacrylates to the EVA and use a thermal-UV dual curing process to prepare the solar module. The curing time is shorten to 5 to 10 min and the yield is high; meanwhile, the EVA film has advantages of uniform curing, high crosslink density, high bonding strength between the film and glass, and good anti-aging property.

6 Claims, No Drawings

DOUBLE INITIATED FAST CROSSLINKING EVA ADHESIVE FILM

CROSS-REFERENCE TO RELATED APPLICATION

This application is the National Stage of International Application Number PCT/CN2014/083889, filed Aug. 7, 2014, which claims priority to Chinese Application No. 201310739474.3, filed Dec. 27, 2013, the disclosures of each of which are incorporated herein by reference in their entirety.

TECHNICAL FIELD

The present invention relates to a dual-initiated and fast cross-linked EVA (ethylene/vinyl acetate copolymer) film.

BACKGROUND ART

Recently, more and more attention has been paid to the study of solar modules because this kind of device can convert solar energy to electricity. Crystalline silicon photovoltaic modules, which accounts for upwards of 90 percent of the solar modules, are made up of a transparent front glass substrate, an adhesive film for encapsulation, a cell, an adhesive film for encapsulation and a backsheet, which are laminated in the order from the bottom to the top, then cured and encapsulated at high temperature. However, it usually takes 20-30 minutes to complete the curing process, which seriously affect the efficiency of encapsulation, especially when the labor is getting more and more expensive today. It is a trend to adopt automatic production line for encapsulating the modules in China in the future as Europe, America and Japanese have almost adopted this product line. Because the automated production line requires much investment, the efficiency of encapsulation is very important. If the curing time of each module is reduced to half, the payback period will also be reduced to half.

There is also a patent about fast cross-linked EVA film, in which a new peroxide is mainly adopted as the initiator, meanwhile, an auxiliary cross-linking agent is added to initiate the reaction fast and cross-link fast. In this way, lamination time can be reduced to 10-15 min. Unfortunately, with the addition of a large amount of the peroxide initiator, a lot of gases of small molecular are released during the lamination, which makes it easier to produce bubbles in the stage of curing the solar module and results in a big challenge for the curing process of the module.

CONTENTS OF INVENTION

The object of the present invention is to provide a dual-initiated and fast cross-linked EVA film for greatly improving the encapsulation speed of solar modules.

In order to achieve the above object, a dual-initiated and fast cross-linked EVA film is provided, which is mainly prepared from the following raw materials:
100 parts by mass of Ethylene/vinyl acetate copolymer,
from 0.01 to 1.5 parts by mass of a free-radical photoinitiator,
from 0.01 to 1.5 parts by mass of a free-radical thermal initiator,
from 0.5 to 10 parts by mass of an auxiliary cross-linking agent,
from 0.1 to 5 parts by mass of a tackifier, and
from 0.01 to 5 parts by mass of a light stabilizer;

wherein,
the melt index of ethylene/vinyl acetate copolymer mentioned above ranges from 7 to 50 g per 10 min, the melting point ranges from 35 DEG to 100 DEG, and the content of vinyl acetate in the ethylene/vinyl acetate copolymer ranges from 15% to 33%;
the free-radical photoinitiator mentioned above is selected from the group consisting of 2-hydroxy-2-methyl-1-phenylketone, 1-hydroxycyclohexylphenylketone, 2-methyl-2-(4-morpholinyl)-1-[4-(methylthio)phenyl]-1-ketone, 2,4,6-trimethylbenzoyl-diphenylphosphine oxide, ethyl (2,4,6-trimethylbenzoyl) phenylphosphinate, 2-dimethylamino-2-benzyl-1-[4-(4-morpholinyl)phenyl]-1-butanone, 2-hydroxy-2-methyl-1-[4-(2-hydroxyethoxy)phenyl]-1-ketone, methyl benzoylformate, and any combination thereof; preferred free-radical photoinitiator is selected from the group consisting of 2-methyl-2-(4-morpholinyl)-1-[4-(methylthio)phenyl]-1-ketone, 2,4,6-trimethylbenzoyl-diphenylphosphine oxide, and ethyl (2,4,6-trimethylbenzoyl) phenylphosphinate;
the free-radical thermal initiator mentioned above is selected from the group consisting of tert-butylperoxy isopropyl carbonate, 2,5-dimethyl-2,5-di(tert-butylperoxy) hexane, 1,1-di-(tert-butylperoxy)-3,3,5-trimethyl cyclohexane, tert-butylperoxy 2-ethylhexyl carbonate, 2,5-bis (tert-butylperoxy)-2,5-dimethyl hexane, and any combination thereof; preferred free-radical thermal initiator is selected from the group consisting of 1,1-di-(tert-butylperoxy)-3,3,5-trimethylcyclohexane, tert-butylperoxy-2-ethylhexyl carbonate, and 2,5-dimethyl-2,5-di(tert-butyl peroxy)hexane;
the auxiliary cross-linking agent mentioned above is selected from the group consisting of tri(2-hydroxyethyl) isocyanurate-triacrylate, trimethylolpropane trimethacrylate, pentaerythritol triacrylate, ethoxylated trimethylolpropane triacrylate, propoxylated trimethylolpropane triacrylate, propoxylated glyceryl triacrylate, trimethylolpropane trimethacrylate, ethoxylated trimethylol propane trimethacrylate, pentaerythritol tetraacrylate, ethoxylated pentaerythritol tetraacrylate, di(trimethyldlpropane) tetraacrylate, propoxylated pentaerythritol tetraacrylate, 2,4,6-tri(2-propenyl oxy)-1,3,5-triazine, dimethylol tricyclodecane diacrylate, propoxylated neopentyl glycol diacrylate, ethoxylated bisphenol A diacrylate, ethoxylated bisphenol A dimethacrylate, 2-butyl-2-ethyl-1,3-propanediol diacrylate, diethylene glycol dimethacrylate, triethylene glycol dimethacrylate, poly(ethylene glycol) dimethacrylate, and any combination thereof; preferred auxiliary cross-linking agent is selected from the group consisting of trimethylolpropane trimethacrylate, ethoxylated trimethylolpropane triacrylate, propoxylated trimethylolpropane triacrylate, propoxylated glyceryl triacrylate, ethoxylated glycerol triacrylate, propoxylated pentaerythritol tetraacrylate, and propoxylated neopentyl glycol diacrylate.

The tackifier is a conventional coupling agent in the art, and the tackifier in the present invention is selected from the group consisting of γ-aminopropyl triethoxy silane, γ-methacryloxypropyl trimethoxy silane, γ-2,3-(epoxypropoxy) propyltrimethoxy silicane, vinyltrimethoxy silane, N-(β-aminoethyl)-γ-aminopropyl trimethoxy silane, and any combination thereof. Preferred tackifier is selected from the group consisting of γ-methacryloxypropyl trimethoxy silane and vinyltrimethoxy silane.

The light stabilizer is a conventional agent for EVA film in the art, and the light stabilizer in the present invention is selected from the group consisting of bis(2,2,6,6-tetramethyl-4-piperidinyl)sebacate, 2,4-dichloro-6-(4-morpholino)-1,3,5-triazine, bis(decane-2,2,6,6-tetramethyl-piperidin-4-ol sebacate, a copolymer of butanedioic acid and 4-hydroxy-2,2,6,6-tetramethyl-1-piperidineethanol, a copolymer of N,N'-bis(2,2,6,6-tetramethyl-4-piperidyl)-1,6-hexanediamine and 2,4-dichloro-6-(1,1,3,3-tetramethylbutyl) amino-1,3,5-triazine, a copolymer of N,N'-bis(2,2,6,6-tetramethyl-4-piperidyl)-1,6-hexanediamine and 2,4-dichloro-6-(4-morpholinyl)-1,3,5-triazine, a copolymer of N,N'-bis(2,2,6,6-tetramethyl-4-piperidyl)-1,6-hexanediamine and morpholine-2,4,6-trichloro-1,3,5-triazine, a compound of bis(1,2,2,6,6-pentamethyl-4-piperidyl) sebacate and methyl-1,2,2,6,6-pentamethyl-4-piperidinyl sebacate, a copolymer of butanedioic acid and 4-hydroxy-2,2,6,6-tetramethyl-1-piperidine-ol, and any combination thereof. Preferred light stabilizer is bis(2,2,6,6-tetramethyl-4-piperidinyl)sebacate or 2,4-dichloro-6-(4-morpholino)-1,3,5-triazine.

The EVA film mentioned above can also comprise some conventional functional additives as required. Therefore, the raw materials can also comprise 0.1-1 parts by mass of a UV-absorber and/or 0.1-1 parts by mass of an antioxidant.

Preferably, the UV-absorber is 2-hydroxy-4-(octyloxy) benzophenone and the antioxidant is 2,6-di-tert-butyl-4-methylphenol.

Preferably, the raw materials for preparing the EVA film are composed of
  100 parts by mass of Ethylene/vinyl acetate copolymer,
  from 0.01 to 1.0 parts by mass of a free-radical photoinitiator,
  from 0.01 to 1.0 parts by mass of a free-radical thermal initiator,
  from 0.5 to 3 parts by mass of an auxiliary cross-linking agent,
  from 0.1 to 1.5 parts by mass of a tackifier, and
  from 0.1 to 1.0 parts by mass of a light stabilizer.

The present invention provides a dual-initiated and fast cross-linked EVA film, which uses a dual initiating system consisting of two kinds of initiators and the auxiliary cross-linking agent of multifunctional acrylates or methacrylates, and then dual initiates the curing. The curing process is fast and can be completed within 10 min, and thus the encapsulation efficiency of the modules can be improved greatly. The fast cured EVA film usually adopts peroxide as the initiator in the conventional process, which decomposes under heating condition to generate free radicals to initiate the curing of the EVA film. In the present invention, the free-radical photoinitiator and free-radical thermal initiator are added, and the acrylic material is used as the auxiliary cross-linking agent, which further speed up the curing process. The acrylic material is an ideal auxiliary cross-linking agent because it is sensitive to both thermal and UV-light initiations.

In the present invention, more qualified products yield in the encapsulation process of the modules, because the addition of lower dosage of peroxide reduces the possibility of generating gases of small molecular as well as bubbles produced during the lamination. The dual initiating system consisting of the free-radical photoinitiator and free-radical thermal initiator initiates the curing, which makes the curing more uniform, the crosslink density higher, the bonding strength between the film and glass higher, and anti-aging property better.

The EVA film in the present invention is prepared by mixing the raw materials consisting of ethylene/vinyl acetate copolymer and other additives, extruding the raw materials in melt, and then casting the melt to obtain a film.

When the EVA film in the present invention is used for encapsulation of the solar module, the procedure is as below: a front glass substrate, an EVA film, a cell, and an EVA film are laminated in the order from the bottom to the top, then transferred to an ultraviolet irradiation chamber for 20 s to 60 s; then covered with a backsheet, put into a laminator, and cured at a temperature between 140° C. and 160° C. for 5 to 10 min.

The beneficial effect of the present invention is as follows: the present invention adds the photo-thermal dual initiating system and the auxiliary cross-linking agent of multi-functional acrylates or methacrylates to the EVA and use a thermal-UV dual curing process to prepare the solar module; therefore, the curing time is shorten to 5-10 min, the yield is high, and the EVA film has advantages of uniform curing, high crosslink density, high bonding strength between the film and glass, and good anti-aging property.

SPECIFIC MODE FOR CARRYING OUT THE INVENTION

Specific explanation of the technical solution for this invention is provided below through examples. This invention is not limited by the examples herein.

Example 1

100 parts by mass of ethylene/vinyl acetate copolymer (DuPont, EVA150) in which the content of VA (vinyl acetate) is 33%, 0.05 parts by mass of the initiator 2-methyl-4'-(methylthio)-2-morpholinopropiophenone (Chengdu Gracia Chemical Technology Co., Ltd.), 0.6 parts by mass of the initiator 2,5-dimethyl-2,5-di(tert-butylperoxy)hexane (J & K Scientific Co., Ltd.), 0.8 parts by mass of the auxiliary cross-linking agent trimethylolpropane trimethacrylate (Shanghai Chunall International Trade Co. Ltd, HC231), 0.2 parts by mass of the tackifier vinyltrimethoxysilane (Shin-Etsu Silicone Co., Ltd., KBM-100), and 0.1 parts by mass of the light stabilizer 2,4-dichloro-6-morpholino-1,3,5-triazine (Jinan Bond Chemical Technology Co., Ltd.) are added and then mixed well.

The mixture is blended and extruded in an extruder at 90° C. The extrudate is then subjected to taper-casting, cooling, slitting and coiling, and then an EVA film with a thickness of 0.45 mm is obtained and marked as S-1.

Example 2

100 parts by mass of ethylene/vinyl acetate copolymer (TPC Singapore Company, KA-40) in which the content of VA (vinyl acetate) is 28%, 0.4 parts by mass of the initiator 2-methyl-4'-(methylthio)-2-morpholinopropiophenone (Chengdu Gracia Chemical Technology Co., Ltd.), 0.4 parts by mass of the initiator 2,5-dimethyl-2,5-di(tert-butylperoxy)hexane (J & K Technology Co., Ltd.), 0.8 parts by mass of the auxiliary cross-linking agent propoxylated glyceryl triacrylate (Tianjin Tianjiao Chemical Co., Ltd.), 0.3 parts by mass of the tackifier γ-methacryloxy propyl trimethoxyl silane (Degussa Chemical Co., KH570), 0.1 parts by mass of the light stabilizer bis(2,2,6,6-tetramethyl-4-piperidinyl) sebacate (Shanghai Boylechem Co. ltd.) are added and then mixed well.

The mixture is blended and extruded in an extruder at 90° C. The extrudate is then subjected to taper-casting, cooling, slitting and coiling, and then an EVA film with a thickness of 0.45 mm is obtained and marked as S-2.

Example 3

100 parts by mass of ethylene/vinyl acetate copolymer (DuPont, EVA150) in which the content of VA (vinyl acetate) is 33%, 0.3 parts by mass of the initiator ethyl (2,4,6-trimethylbenzoyl) phenylphosphinate (J & K Scientific Co., Ltd.), 0.4 parts by mass of the initiator 2,5-dimethyl-2,5-di(tert-butylperoxy)hexane (J & K Scientific Co., Ltd.), 0.8 parts by mass of the auxiliary cross-linking agent trimethylolpropane trimethacrylate (Tianjin Tianjiao Chemical Co., Ltd.), 0.2 parts by mass of the tackifier γ-methacryloxy propyl trimethoxyl silane (Degussa Chemical Co., KH570), 0.1 parts by mass of the light stabilizer bis(2,2,6,6-tetramethyl-4-piperidinyl)sebacate (Shanghai Boylechem Co. ltd.) are added and then mixed well.

The mixture is blended and extruded in an extruder at 90° C. The extrudate is then subjected to taper-casting, cooling, slitting and coiling, and then an EVA film with a thickness of 0.45 mm is obtained and marked as S-3.

Example 4

100 parts by mass of ethylene/vinyl acetate copolymer (Formosa Plastics Corporation, 7470M) in which the content of VA (vinyl acetate) is 26%, 0.6 parts by mass of the initiator ethyl (2,4,6-trimethylbenzoyl) phenylphosphinate (J & K Scientific Co., Ltd.), 0.8 parts by mass of the initiator tert-butylperoxy 2-ethylhexyl carbonate (Akzo Nobel Chemicals Co., Ltd.), 3 parts by mass of the auxiliary cross-linking agent propoxylated trimethylolpropane triacrylate (Tianjin United Chemical Reagent), 1.5 parts by mass of the tackifier vinyltrimethoxysilane (Shin-Etsu Silicone Co., Ltd., KBM-100), 0.5 parts by mass of the light stabilizer bis(2,2,6,6-tetramethyl-4-piperidinyl)sebacate (Shanghai Boylechem Co. ltd.) are added and then mixed well.

The mixture is blended and extruded in an extruder at 90° C. The extrudate is then subjected to taper-casting, cooling, slitting and coiling, and then an EVA film with a thickness of 0.45 mm is obtained and marked as S-4.

Example 5

100 parts by mass of ethylene/vinyl acetate copolymer (DuPont, EVA150) in which the content of VA (vinyl acetate) is 33%, 1 part by mass of the initiator ethyl (2,4,6-trimethylbenzoyl) phenylphosphinate (TCI Shanghai), 0.4 parts by mass of the initiator tert-butylperoxy 2-ethylhexyl carbonate (Akzo Nobel Chemicals Co., Ltd.), 3 parts by mass of the auxiliary cross-linking agent propoxylated trimethylolpropane triacrylate (Tianjin United Chemical Reagent), 1.5 parts by mass of the tackifier vinyltrimethoxysilane (Nanjing Union Silicon Chemical Co., KH-570), 1 part by mass of the light stabilizer bis(2,2,6,6-tetramethyl-4-piperidinyl)sebacate (Shanghai Boylechem Co. ltd.) are added and then mixed well.

The mixture is blended and extruded in an extruder at 90° C. The extrudate is then subjected to taper-casting, cooling, slitting and coiling, and then an EVA film with a thickness of 0.45 mm is obtained and marked as S-5.

Example 6

100 parts by mass of ethylene/vinyl acetate copolymer (Singapore company, KA-40 TPC) in which the content of VA (vinyl acetate) is 28%, 0.01 parts by mass of the initiator ethyl (2,4,6-trimethylbenzoyl) phenylphosphinate (TCI Shanghai), 1 part by mass of the initiator tert-butylperoxy 2-ethylhexyl carbonate (Akzo Nobel Chemicals Co., Ltd.), 0.6 parts by mass of the auxiliary cross-linking agent Propoxylated pentaerythritol tetraacrylate (Shanghai Chunall International Trade Co. Ltd, EM2421), 0.2 parts by mass of the tackifier vinyltrimethoxysilane (Nanjing Union Silicon Chemical Co., KH-570), 0.1 parts by mass of the light stabilizer 2,4-dichloro-6-morpholino-1,3,5-triazine (Jinan Bond Chemical Technology Co., Ltd.) are added and then mixed well.

The mixture is blended and extruded in an extruder at 90° C. The extrudate is then subjected to taper-casting, cooling, slitting and coiling, and then an EVA film with a thickness of 0.45 mm is obtained and marked as S-6.

Example 7

100 parts by mass of ethylene/vinyl acetate copolymer (Singapore company, KA-40 TPC) in which the content of VA (vinyl acetate) is 28%, 2 parts by mass of the initiator ethyl (2,4,6-trimethylbenzoyl) phenylphosphinate (TCI Shanghai), 1 part by mass of the initiator tert-butylperoxy 2-ethylhexyl carbonate (Akzo Nobel Chemicals Co., Ltd.), 0.6 parts by mass of the auxiliary cross-linking agent propoxylated pentaerythritol tetraacrylate (Shanghai Chunall International Trade Co. Ltd., EM2421), 1 part by mass of the tackifier vinyltrimethoxysilane (Nanjing Union Silicon Chemical Co., KH-570), 0.6 parts by mass of the light stabilizer 2,4-dichloro-6-morpholino-1,3,5-triazine (Jinan Bond Chemical Technology Co., Ltd.) are added and mixed well.

The mixture is blended and extruded in an extruder at 90° C. The extrudate is then subjected to taper-casting, cooling, slitting and coiling, and then an EVA film with a thickness of 0.45 mm is obtained and marked as S-7.

Example 8

100 parts by mass of ethylene/vinyl acetate copolymer (Singapore company, KA-40 TPC) in which the content of VA (vinyl acetate) is 28%, 0.2 parts by mass of the initiator 2-methyl-4'-(methylthio)-2-morpholinopropiophenone (Chengdu Gracia Chemical Technology Co., Ltd.), 0.2 parts by mass of the initiator tert-butylperoxy 2-ethylhexyl carbonate (Akzo Nobel Chemicals Co., Ltd.), 0.6 parts by mass of the auxiliary cross-linking agent ethoxylated glycerol triacrylate (Chengdu Grecia Chemical Technology Co., Ltd.), 0.2 parts by mass of the tackifier γ-methacryloyloxy trimethoxysilane (Nanjing Union Silicon Chemical Co., KH-570), 0.1 parts by mass of the light stabilizer bis(2,2,6,6-tetramethyl-4-piperidinyl) sebacate (Shanghai Boylechem Co. ltd.) are added and then mixed well.

The mixture is blended and extruded in an extruder at 90° C. The extrudate is then subjected to taper-casting, cooling, slitting and coiling, and then an EVA film with a thickness of 0.45 mm is obtained and marked as S-8.

Comparative Example 1

Bridgestone SI 1 EVA film, called D-1.

Comparative Example 2

The process is the same to the process described in example 1 except that 0.8 parts by mass of the auxiliary cross-linking agent trimethylolpropane trimethacrylate (Shanghai Chunall International Trade Co. Ltd., HC231) is substituted for 0.8 parts by mass of a curing agent triallyl isocyanurate (Akzo Nobel Chemicals Co., Ltd.), and the EVA film produced is marked as D-2.

The performances of the EVA films produced above are tested by the means interpreted below:

1. Degree of Cross-Linking

Sample preparation: Take a piece of glass with a size of 150 mm×150 mm and a thickness of 3 mm, an EVA film and a backsheet for test, and they are laminated in the order of glass/EVA film/EVA film from the bottom to the top. Then the intermediate product is transferred into a UV irradiation chamber with a 40 W UVA lamp and subjected to irradiation for 30 s, then covered with the backsheet, and then transferred to a laminating machine and subjected to curing at 150° C. for 8 min. In Comparative example 1 and 2, glass, EVA film and backsheet are put into the vacuum laminator in the order of glass/EVA film/EVA film/backsheet, and subjected to curing at 150° C. for 8 min. When the curing is completed, strip the backsheet of the sample, then take approximately 1 g of the cross-linked and cured EVA film from the middle of the sample with a blade for the cross-linking degree test.

The test method is carried out as below:

(1) Principle

The EVA film forms cross-links by heating and curing. Dimethylbenzene is used for dissolving the non-crosslinked parts of the sample, thereby the degree of crosslinking can be determined.

(2) Instruments (a) a 500 ml, three-necked, round-bottomed flask with 24 # ground stoppers;

(b) a reflux condenser with a 24 # ground stopper;

(c) An electric heating mantle equipped with a temperature control device;

(d) An electronic balance with an accuracy of 0.001 g;

(e) A vacuum oven;

(f) A stainless steel mesh bag: Scissor a 120 mesh stainless steel wire mesh by a size of 120 mm×60 mm, then fold it in half into a size of 60 mm×60 mm, fold two sides inward and 5 mm every time, after folded twice, the sides are fixed, and then a mesh bag with a opening at the top and a size of 60 mm×40 mm is formed.

(3) Reagent

Dimethylbenzene (A.R grade)

(4) Sample Preparation

The EVA film made above: S-1~S-8, D-1 and D-2.

(5) Experiment (a) The stainless steel mesh bag is washed, dried, and weighed, and the weight is marked as $W_1$ (accurate to 0.001 g)

(b) 0.5 g±0.01 g of the sample is put into the washed stainless steel mesh bag and a sample bag is obtained. Then the sample bag is weighed and the weight is marked as $W_2$ (accurate to 0.001 g).

(c) Seal the sample bag with a thin wire, and then tagged. The sample bag is put into the three-necked flask through a side neck and the side necks are sealed with rubber stoppers. Add dimethylbenzene to the flask with a volume of half the flask in order to make the sample bag submerged in the solvent totally. Then the system is heated to 140° C. to reflux for 5 h. The rate of reflux remains to be 20 drops per minute to 40 drops per minute.

(d) Take out the sample bag after the reflux is completed, it hangs in order to remove the solvent, then is put into a vacuum drier and dried at 140° C. for 3 h to completely remove the solvent.

(e) Take the sample bag out of the vacuum drier, remove the thin wire, then the sample bag is put into a drier and cooled for 20 min, then it is take out and weighed, and the weight is marked as $W_3$ (accurate to 0.001 g).

(6) Results

The degree of crosslinking is calculated according to function (2). Take the arithmetic mean of two groups as the result (accurate to 0.1%).

$$G = \frac{W_3 - W_1}{W_2 - W_1} \times 100 \qquad (2)$$

in which:

G—degree of crosslinking; (%)

$W_1$—the weight of the stainless steel mesh bag; (g)

$W_2$—the weight of the sample bag; (g)

$W_3$—the weight of the sample bag after solvent extraction and drying

2. The Bond Strengthen of Glass and the Film

The test method refers to the national standard GB/T2790 ("Adhesives, 180° peel strength test method for a flexible-to-rigid test specimen assembly").

Sample Preparation:

Take a piece of glass with a size of 150 mm×150 mm and a thickness of 3 mm, an EVA film and a backsheet for test, and they are laminated in the order of glass/EVA film/EVA film from the bottom to the top. Then the intermediate product is transferred into a UV irradiation chamber with a 40 W UVA lamp and subjected to irradiation for 30 s, then covered with the backsheet, and transferred to a laminating machine and subjected to curing at 150° C. for 8 min. In Comparative example 1 and 2, glass, EVA film and backsheet are put into the vacuum laminator in the order of glass/EVA film/EVA film/backsheet, and subjected to curing at 150° C. for 8 min.

A tension test machine is used, the test is carried out at a speed of 100 mm per minute, and the values of tensile strength are recorded.

3. Resistance to Heat-Humidity Aging.

The test method refers to the method in GB/T2423.3

Sample preparation: Take a piece of glass with a size of 150 mm×150 mm and a thickness of 3 mm, an EVA film and a backsheet for test, and they are laminated in the order of glass/EVA film/EVA film from the bottom to the top. Then the intermediate product is transferred into a UV irradiation chamber with a 40 W UVA lamp and subjected to irradiation for 30 s, then covered with the backsheet, and transferred to a laminating machine and subjected to curing at 150° C. for 8 min. In Comparative example 1 and 2, glass, EVA film and backsheet are put into the vacuum laminator in the order of glass/EVA film/EVA film/backsheet, and subjected to curing at 150° C. for 8 min.

Test conditions: Temperature: 85° C.; Relative humidity 85%, Time: 1000 h.

The yellowness index ($\Delta YI$) of the sample before and after the test is measured according to the national standard GB2409 ("Plastic-Yellowness index test method") by HunterLab ColorQuest color photometer, and analyzed according to ASTM.

4. Resistance to UV Aging

The test method refers to the method in GB/T19394-2003.

Sample preparation: cut the glass, EVA film and backsheet for test according to the size of the test rack, and they are laminated in the order of glass/EVA film/EVA film from the bottom to the top. Then the intermediate product is transferred into a UV irradiation chamber with a 40 W UVA lamp and subjected to irradiation for 30 s, then covered with the backsheet, and transferred to a laminating machine and subjected to curing at 150° C. for 8 min. In Comparative example 1 and 2, glass, EVA film and backsheet are put into the vacuum laminator in the order of glass/EVA film/EVA film/backsheet, and subjected to curing at 150° C. for 8 min.

The test conditions are as follows: temperature: 60° C., radiation wavelength: 280 nm~400 nm, irradiation intensity: 120 kwh/m$^2$.

The yellowness index (ΔYI) of the sample before and after the test is measured according to the national standard GB2409 ("Plastic-Yellowness index test method") by HunterLab ColorQuest color photometer, and analyzed according to ASTM. And the results are shown in Table 1.

TABLE 1

| | Film performance parameters | | | |
|---|---|---|---|---|
| Mark | Degree of crosslinking (%) | Bond strengthen bonded to glass (N/cm) | Yellowness index (ΔYI) after heat-humidity aging | Yellowness index (ΔYI) after UV aging |
| S-1 | 79.3 | 121 | 3.2 | 2.8 |
| S-2 | 91.5 | 182 | 2.8 | 3.5 |
| S-3 | 89.6 | 146 | 2.2 | 2.8 |
| S-4 | 88.7 | 204 | 2.4 | 3.8 |
| S-5 | 88.6 | 111 | 3.3 | 2.9 |
| S-6 | 85.3 | 135 | 2.9 | 2.4 |
| S-7 | 83.2 | 171 | 3.0 | 3.1 |
| S-8 | 82.8 | 143 | 2.8 | 3.6 |
| D-1 | 66.8 | 89 | 4.7 | 4.2 |
| D-2 | 71.4 | 78 | 2.9 | 2.8 |

We can learn from the above table that the fast cross-linked EVA film produced in this invention has advantages of high crosslink speed, high peel strengthen and good anti-aging performances. Thus, it is suitable for the encapsulation of solar modules.

What is claimed is:

1. A dual-initiated and fast cross-linked ethylene/vinyl acetate (EVA) film, which is mainly prepared from the following raw materials:
   100 parts by mass of EVA copolymer,
   from 0.01 to 1.5 parts by mass of a free-radical photoinitiator,
   from 0.01 to 1.5 parts by mass of a free-radical thermal initiator,
   from 0.5 to 10 parts by mass of an auxiliary cross-linking agent,
   from 0.1 to 5 parts by mass of a tackifier, and
   from 0.01 to 5 parts by mass of a light stabilizer;
   wherein,
   the melt index of ethylene/vinyl acetate copolymer ranges from 7 to 50 g per 10 min, the melting point of ethylene/vinyl acetate copolymer ranges from 35° C. to 100° C., and the content of vinyl acetate in the ethylene/vinyl acetate copolymer ranges from 15% to 33%;
   the free-radical photoinitiator is selected from the group consisting of 2-hydroxy-2-methyl-1-phenylketone, 1-hydroxycyclohexylphenylketone, 2-methyl-2-(4-morpholinyl)-1-[4-(methylthio)phenyl]-1-ketone, 2,4,6-trimethylbenzoyl-diphenylphosphine oxide, ethyl (2,4,6-trimethylbenzoyl) phenylphosphinate, 2-dimethylamino-2-benzyl-1-[4-(4-morpholinyl) phenyl]-1-butanone, 2-hydroxy-2-methyl-1-[4-(2-hydroxyethoxy) phenyl]-1-ketone, methyl benzoylformate, and any combination thereof;
   the free-radical thermal initiator is selected from the group consisting of tert-butylperoxy isopropyl carbonate, 2,5-dimethyl-2,5-di(tert-butylperoxy)hexane, 1,1-di-(tert-butylperoxy)-3,3,5-trimethyl cyclohexane, tert-butylperoxy 2-ethylhexyl carbonate, and any combination thereof;
   the auxiliary cross-linking agent is selected from the group consisting of tri(2-hydroxyethyl) isocyanurate-triacrylate, trimethylolpropane trimethacrylate, pentaerythritol triacrylate, ethoxylated trimethylolpropane triacrylate, propoxylated trimethylolpropane triacrylate, propoxylated glyceryl triacrylate, trimethylolpropane trimethacrylate, ethoxylated trimethylol propane trimethacrylate, pentaerythritol tetraacrylate, ethoxylated pentaerythritol tetraacrylate, di(trimethyldlpropane) tetraacrylate, propoxylated pentaerythritol tetraacrylate, 2,4,6-tri(2-propenyl oxy)-1,3,5-triazine, dimethylol tricyclodecane diacrylate, propoxylated neopentyl glycol diacrylate, ethoxylated bisphenol A diacrylate, ethoxylated bisphenol A dimethacrylate, 2-butyl-2-ethyl-1,3-propanediol diacrylate, diethylene glycol dimethacrylate, triethylene glycol dimethacrylate, poly(ethylene glycol) dimethacrylate, and any combination thereof.

2. The EVA film according to claim 1, wherein the tackifier is selected from the group consisting of γ-aminopropyl triethoxy silane, γ-methacryloxypropyl trimethoxy silane, γ-2,3-(epoxypropoxy)propyltrimethoxy silicane, vinyltrimethoxy silane, N-(β-aminoethyl)-γ-aminopropyl trimethoxy silane, and any combination thereof.

3. The EVA film according to claim 1, wherein the light stabilizer is selected from the group consisting of bis(2,2,6,6-tetramethyl-4-piperidinyl) sebacate, 2,4-dichloro-6-(4-morpholino)-1,3,5-triazine, bis(decane-2,2,6,6-tetramethyl-piperidin-4-ol sebacate, a copolymer of butanedioic acid and 4-hydroxy-2,2,6,6-tetramethyl-1-piperidineethanol, a copolymer of N,N'-bis(2,2,6,6-tetramethyl-4-piperidyl)-1,6-hexanediamine and 2,4-dichloro-6-(1,1,3,3-tetramethylbutyl) amino-1,3,5-triazine, a copolymer of N,N'-bis(2,2,6,6-tetramethyl-4-piperidyl)-1,6-hexanediamine and 2,4-dichloro-6-(4-morpholinyl)-1,3,5-triazine, a copolymer of N,N'-bis(2,2,6,6-tetramethyl-4-piperidyl)-1,6-hexanediamine and morpholine-2,4,6-trichloro-1,3,5-triazine, a compound of bis(1,2,2,6,6-pentamethyl-4-piperidyl) sebacate and methyl-1,2,2,6,6-pentamethyl-4-piperidinyl sebacate, a copolymer of butanedioic acid and 4-hydroxy-2,2,6,6-tetramethyl-1-piperidine-ol, and any combination thereof.

4. The EVA film according to claim 1, wherein the raw materials also comprise 0.1 to 1 parts by mass of a ultraviolet absorber and/or 0.01 to 1 parts by mass of an antioxidant.

5. The EVA film according to claim 4, wherein the ultraviolet absorber is 2-hydroxy-4-(octyloxy)benzophenone and the antioxidant is 2,6-di-tert-butyl-4-methylphenol.

6. The EVA film according to claim 1, wherein the raw materials for preparing the EVA film are composed of
   100 parts by mass of EVA copolymer,
   from 0.01 to 1.0 parts by mass of a free-radical photoinitiator,
   from 0.01 to 1.0 parts by mass of a free-radical thermal initiator,
   from 0.5 to 3 parts by mass of an auxiliary cross-linking agent,
   from 0.1 to 1.5 parts by mass of a tackifier, and
   from 0.1 to 1.0 parts by mass of a light stabilizer.

* * * * *